US010780447B2

(12) United States Patent
Fovell et al.

(10) Patent No.: US 10,780,447 B2
(45) Date of Patent: Sep. 22, 2020

(54) APPARATUS FOR CONTROLLING TEMPERATURE UNIFORMITY OF A SHOWERHEAD

(71) Applicant: APPLIED MATERIALS, INC., Santa Clara, CA (US)

(72) Inventors: Richard Fovell, San Jose, CA (US); Silverst Rodrigues, Bangalore (IN); James D. Carducci, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 536 days.

(21) Appl. No.: 15/497,814

(22) Filed: Apr. 26, 2017

(65) Prior Publication Data

US 2017/0304849 A1    Oct. 26, 2017

Related U.S. Application Data

(60) Provisional application No. 62/327,983, filed on Apr. 26, 2016.

(51) Int. Cl.
*B05B 1/24* (2006.01)
*H01J 37/32* (2006.01)
(Continued)

(52) U.S. Cl.
CPC .......... *B05B 1/24* (2013.01); *C23C 16/45572* (2013.01); *H01J 37/32449* (2013.01);
(Continued)

(58) Field of Classification Search
None
See application file for complete search history.

(56) References Cited

U.S. PATENT DOCUMENTS 3,205,939 A * 9/1965 Huet .................. F22B 1/16
165/144
3,524,497 A * 8/1970 Chu .................... H01L 23/473
165/104.33
(Continued)

FOREIGN PATENT DOCUMENTS

CN     103334092 A * 10/2013 ............ F28F 9/0221
KR  20080041893 A *  5/2008 ....... C23C 16/45565
(Continued)

*Primary Examiner* — Jeffrie R Lund
*Assistant Examiner* — Stanislav Antolin
(74) *Attorney, Agent, or Firm* — Moser Taboada; Alan Taboada

(57) ABSTRACT

Apparatus for controlling thermal uniformity of a substrate-facing surface of a showerhead are provided herein. In some embodiments, a heat transfer system includes a heat transfer plate having a first diameter and a plurality of independent flow paths disposed within the heat transfer plate, each flow path having a first inlet and a first outlet; a supply conduit system having a second inlet fluidly coupled to a plurality of second outlets, wherein each second outlet is fluidly coupled to a corresponding first inlet of the heat transfer plate; and a return conduit system having a third outlet fluidly coupled to a plurality of third inlets, wherein each third inlet is fluidly coupled to a corresponding first outlet of the heat transfer plate, wherein the supply conduit system and the return conduit system are each disposed within an imaginary cylindrical projection above the heat transfer plate.

20 Claims, 5 Drawing Sheets

(51) Int. Cl.
*C23C 16/455* (2006.01)
*C23C 16/44* (2006.01)

(52) U.S. Cl.
CPC ...... *C23C 16/4411* (2013.01); *C23C 16/4557* (2013.01); *C23C 16/45565* (2013.01); *H01J 37/32082* (2013.01)

(56) References Cited

U.S. PATENT DOCUMENTS

| | | | | |
|---|---|---|---|---|
| 4,275,289 A * | 6/1981 | Lord | H01L 21/67109 | 165/156 |
| 4,361,749 A * | 11/1982 | Lord | H01J 37/32431 | 165/154 |
| 4,392,362 A * | 7/1983 | Little | B21D 53/045 | 165/168 |
| 4,962,809 A * | 10/1990 | Belcher | F25J 5/002 | 165/100 |
| 5,155,652 A * | 10/1992 | Logan | H01L 21/6831 | 279/128 |
| 5,309,319 A * | 5/1994 | Messina | H01L 23/4336 | 165/142 |
| 5,388,635 A * | 2/1995 | Gruber | F28F 3/12 | 165/185 |
| 5,534,328 A * | 7/1996 | Ashmead | B01F 5/0604 | 210/150 |
| 5,935,337 A * | 8/1999 | Takeuchi | C23C 16/45565 | 118/724 |
| 6,033,478 A * | 3/2000 | Kholodenko | H01L 21/6831 | 118/500 |
| 6,035,929 A * | 3/2000 | Friedel | F01D 11/24 | 165/168 |
| 6,079,356 A * | 6/2000 | Umotoy | C23C 16/455 | 118/723 E |
| 6,740,853 B1 * | 5/2004 | Johnson | C23C 16/4586 | 118/620 |
| 9,267,742 B2 | 2/2016 | Bera et al. | | |
| 10,170,279 B2 * | 1/2019 | Kenney | H01J 37/3211 | |
| 2001/0045269 A1 * | 11/2001 | Yamada | F28D 9/0012 | 165/80.1 |
| 2001/0047760 A1 * | 12/2001 | Moslehi | H01J 37/321 | 118/723 I |
| 2002/0092471 A1 * | 7/2002 | Kang | C23C 16/455 | 118/715 |
| 2003/0037729 A1 * | 2/2003 | DeDontney | C23C 16/4412 | 118/715 |
| 2003/0159307 A1 * | 8/2003 | Sago | H01L 21/67017 | 34/107 |
| 2004/0187787 A1 * | 9/2004 | Dawson | C23C 16/4586 | 118/728 |
| 2004/0244945 A1 * | 12/2004 | Lee | F28D 15/02 | 165/47 |
| 2005/0009175 A1 * | 1/2005 | Bergh | C07C 45/35 | 435/287.2 |
| 2005/0211418 A1 * | 9/2005 | Kenny | F04B 17/00 | 165/80.4 |
| 2005/0254028 A1 * | 11/2005 | Box | G03F 7/707 | 355/53 |
| 2006/0021574 A1 * | 2/2006 | Armour | C23C 16/45565 | 118/715 |
| 2006/0242967 A1 * | 11/2006 | Lin | H01L 21/67109 | 62/3.3 |
| 2006/0254762 A1 * | 11/2006 | Tao | F28F 23/00 | 165/177 |
| 2006/0275185 A1 * | 12/2006 | Tonkovich | F28F 13/06 | 422/130 |
| 2007/0079936 A1 * | 4/2007 | Li | C04B 35/63452 | 156/345.48 |
| 2007/0119565 A1 * | 5/2007 | Brunschwiler | H01L 23/4735 | 165/80.2 |
| 2007/0139856 A1 * | 6/2007 | Holland | H01L 21/67103 | 361/234 |
| 2007/0165356 A1 * | 7/2007 | Nguyen | H01L 21/67109 | 361/234 |
| 2007/0248515 A1 * | 10/2007 | Tompa | C23C 16/407 | 423/179 |
| 2008/0017627 A1 * | 1/2008 | Iwata | H01L 21/67109 | 219/260 |
| 2008/0035306 A1 * | 2/2008 | White | C23C 16/4586 | 165/61 |
| 2008/0202425 A1 * | 8/2008 | Gelatos | C23C 16/14 | 118/724 |
| 2008/0206987 A1 * | 8/2008 | Gelatos | C23C 16/14 | 438/654 |
| 2008/0236495 A1 * | 10/2008 | Tompa | C23C 16/45565 | 118/724 |
| 2009/0042321 A1 * | 2/2009 | Sasaki | H01J 37/32449 | 438/10 |
| 2009/0107403 A1 * | 4/2009 | Moshtagh | C23C 16/45504 | 118/728 |
| 2009/0159566 A1 * | 6/2009 | Brillhart | C23C 14/505 | 216/58 |
| 2009/0162260 A1 * | 6/2009 | Bera | H01J 37/321 | 422/186.04 |
| 2009/0274549 A1 * | 11/2009 | Mitchell | F01D 5/186 | 415/115 |
| 2009/0275206 A1 * | 11/2009 | Katz | H01J 37/3244 | 438/714 |
| 2010/0206235 A1 * | 8/2010 | He | C23C 16/4412 | 118/729 |
| 2010/0209082 A1 * | 8/2010 | He | C23C 16/4412 | 392/411 |
| 2010/0209620 A1 * | 8/2010 | He | H01L 21/67784 | 427/557 |
| 2010/0209626 A1 * | 8/2010 | He | C23C 16/4412 | 427/585 |
| 2010/0229793 A1 * | 9/2010 | He | C23C 16/45565 | 118/715 |
| 2011/0108195 A1 * | 5/2011 | Nishimoto | H01J 37/32192 | 156/345.37 |
| 2011/0162800 A1 * | 7/2011 | Noorbakhsh | C23C 16/45565 | 156/345.34 |
| 2011/0180233 A1 * | 7/2011 | Bera | F28F 7/02 | 165/47 |
| 2011/0291568 A1 * | 12/2011 | Iizuka | H01J 37/321 | 315/111.51 |
| 2011/0303641 A1 * | 12/2011 | Mahadeswaraswamy | H01J 37/32522 | 216/67 |
| 2012/0048467 A1 * | 3/2012 | Mahadeswaraswamy | H01J 37/32522 | 156/345.27 |
| 2012/0156877 A1 * | 6/2012 | Yap | C23C 16/4412 | 118/715 |
| 2012/0273162 A1 * | 11/2012 | Mahadeswaraswamy | H01L 21/67784 | 427/557 |
| 2013/0174924 A1 * | 7/2013 | Luo | F28F 9/0221 | 137/561 A |
| 2014/0061324 A1 * | 3/2014 | Mohn | H01L 23/4336 | 165/142 |
| 2014/0096716 A1 * | 4/2014 | Chung | G03F 7/707 | 355/53 |
| 2014/0265832 A1 * | 9/2014 | Kenney | C23C 16/509 | 315/34 |
| 2014/0306027 A1 * | 10/2014 | Xu | H01L 21/6831 | 118/500 |
| 2017/0304849 A1 * | 10/2017 | Fovell | B05B 1/24 | |
| 2017/0365443 A1 * | 12/2017 | Carducci | H01J 37/32009 | |
| 2018/0142352 A1 * | 5/2018 | Shah | F22B 1/16 | 165/144 |
| 2018/0187305 A1 * | 7/2018 | Hawrylchak | F28F 9/0221 | 137/561 A |

(56) References Cited

U.S. PATENT DOCUMENTS

FOREIGN PATENT DOCUMENTS

| | | | |
|---|---|---|---|
| WO | WO 2011/094143 A2 | 8/2011 | |
| WO | WO-2012010620 A1 * | 1/2012 | ............ F28F 9/0221 |
| WO | WO-2013029500 A1 * | 3/2013 | ....... C23C 16/45565 |

* cited by examiner

APPARATUS FOR CONTROLLING TEMPERATURE UNIFORMITY OF A SHOWERHEAD

CROSS-REFERENCE TO RELATED APPLICATIONS

This application claims benefit of provisional patent application Ser. No. 62/327,983, filed Apr. 26, 2016, which is herein incorporated by reference in its entirety.

FIELD

Embodiments of the present disclosure generally relate to apparatus for substrate processing.

BACKGROUND

In many conventional substrate processes, cooling channels may be provided in a gas distribution apparatus, or showerhead, to facilitate cooling a processing volume-facing faceplate of the showerhead during processing to maintain a predetermined temperature profile on the faceplate. The cooling channels are typically configured to facilitate providing a predetermined temperature profile of the showerhead faceplate during substrate processing. However, the inventors have observed that conventional showerheads often do not provide sufficiently uniform thermal profiles such that substrate processing results may be non-uniform as a result.

Thus, the inventors have provided an improved apparatus for controlling the temperature profile of a faceplate of a showerhead.

SUMMARY

Apparatus for controlling thermal uniformity of a substrate-facing surface of a showerhead are provided herein. In some embodiments, a heat transfer system includes a heat transfer plate having a first diameter and a plurality of independent flow paths disposed within the heat transfer plate, each flow path having a first inlet and a first outlet; a supply conduit system having a second inlet fluidly coupled to a plurality of second outlets, wherein each second outlet is fluidly coupled to a corresponding first inlet of the heat transfer plate; and a return conduit system having a third outlet fluidly coupled to a plurality of third inlets, wherein each third inlet is fluidly coupled to a corresponding first outlet of the heat transfer plate, wherein the supply conduit system and the return conduit system are each disposed within an imaginary cylindrical projection above the heat transfer plate.

In some embodiments, a process chamber includes a showerhead having a substrate facing surface and one or more plenums for providing one or more process gases through a plurality of gas distribution holes formed through the substrate facing surface of the showerhead; and a heat transfer system coupled to the showerhead. The heat transfer system includes a heat transfer plate having a first diameter and a plurality of independent flow paths disposed within the heat transfer plate, each flow path having a first inlet and a first outlet; a supply conduit system having a second inlet fluidly coupled to a plurality of second outlets, wherein each second outlet is fluidly coupled to a corresponding first inlet of the heat transfer plate; and a return conduit system having a third outlet fluidly coupled to a plurality of third inlets, wherein each third inlet is fluidly coupled to a corresponding first outlet of the heat transfer plate, wherein the supply conduit system and the return conduit system are each disposed within an imaginary cylindrical projection above the heat transfer plate.

In some embodiments, a heat transfer system includes a heat transfer plate having a first diameter and a plurality of independent flow paths disposed within the heat transfer plate, each flow path having a first inlet and a first outlet; a supply conduit system having a second inlet fluidly coupled to a plurality of second outlets, wherein each second outlet is fluidly coupled to a corresponding first inlet of the heat transfer plate; and a return conduit system having a third outlet fluidly coupled to a plurality of third inlets, wherein each third inlet is fluidly coupled to a corresponding first outlet of the heat transfer plate; a plurality of supply lines, each of which is fluidly coupled to one of the plurality of second outlets at a first end and to a corresponding first inlet at a second end opposite the first end; and a plurality of return lines, each of which is fluidly coupled to a corresponding first outlet at a third end and to one of the plurality of third inlets at a fourth end opposite the third end, wherein the supply conduit system and the return conduit system are each disposed within an imaginary cylindrical projection above the heat transfer plate.

The above summary is provided to briefly discuss some aspects of the present disclosure and is not intended to be limiting of the scope of the disclosure. Other embodiments and variations of the disclosure are provided below in the detailed description.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the present disclosure and are therefore not to be considered limiting of the scope of the present disclosure, for the disclosure may admit to other equally effective embodiments.

Figure 1:
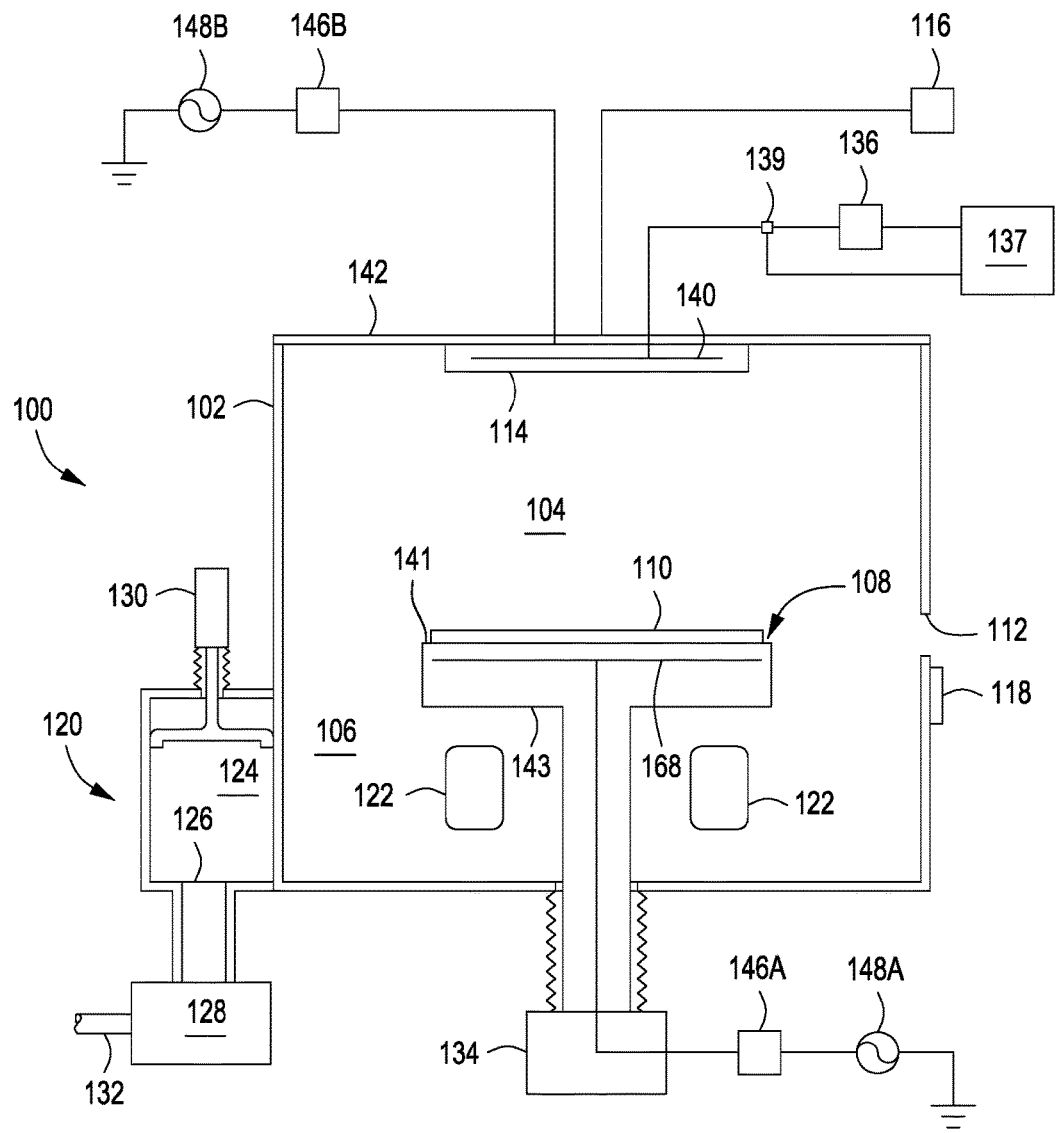
FIG. 1 depicts a process chamber having a showerhead in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The inventors have observed that conventional showerheads may have undesirable temperature profiles, which may lead to undesirable process results. Embodiments of the present disclosure provide apparatus for controlling the temperature of a showerhead during processing. The apparatus may control the thermal uniformity of the showerhead during processing. In some embodiments the inventive apparatus may advantageously provide a showerhead having a plurality of flow paths which provide an increased flow rate of heat transfer medium, thus facilitating control of temperature across a faceplate of the showerhead.

FIG. 1 depicts a process chamber 100 suitable for use in connection with an apparatus for controlling temperature uniformity of a showerhead in accordance with some embodiments of the present disclosure. Exemplary process chambers may include the DPS®, ENABLER®, SIGMA™, ADVANTEDGE™, or other process chambers, available from Applied Materials, Inc. of Santa Clara, Calif. Other suitable chambers include any chambers that use showerheads to perform substrate fabrication processes.

In some embodiments, the process chamber 100 generally comprises a chamber body 102 defining an inner processing volume 104 and an exhaust volume 106. The inner processing volume 104 may be defined, for example, between a substrate support 108 disposed within the process chamber 100 for supporting a substrate 110 thereupon during processing and one or more gas inlets, such as a showerhead 114 and/or nozzles provided at predetermined locations. The exhaust volume may be defined, for example, between the substrate support 108 and a bottom of the process chamber 100.

The substrate support 108 generally comprises a body 143 having a substrate support surface 141 for supporting a substrate 110 thereon. In some embodiments, the substrate support 108 may include a mechanism that retains or supports the substrate 110 on the surface of the substrate support 108, such as an electrostatic chuck, a vacuum chuck, a substrate retaining clamp, or the like (not shown).

In some embodiments, the substrate support 108 may include a radio frequency (RF) bias electrode 168. The RF bias electrode may be coupled to one or more RF bias power sources through one or more respective matching networks (one RF bias power source 148A and one matching network 146A shown in FIG. 1). The one or more bias power sources may be capable of producing up to 12000 W at a frequency of about 2 MHz, or about 13.56 MHz, or about 60 MHz. In some embodiments, two bias power sources may be provided for coupling RF power through respective matching networks to the RF bias electrode at a frequency of about 2 MHz and about 13.56 MHz. In some embodiments, three bias power sources may be provided for coupling RF power through respective matching networks to the RF bias electrode at a frequency of about 2 MHz, about 13.56 MHz, and about 60 MHz. The at least one bias power source may provide either continuous or pulsed power. In some embodiments, the bias power source may be a DC or pulsed DC source.

In some embodiments, the substrate support 108 may include one or more mechanisms for controlling the temperature of the substrate support surface 141 and the substrate 110 disposed thereon. For example, one or more channels (not shown) may be provided to define one or more flow paths beneath the substrate support surface to flow a heat transfer medium similar to as described below with respect to the showerhead 114.

The one or more gas inlets (e.g., the showerhead 114) may be coupled to a gas supply 116 for providing one or more process gases into the inner process volume 104 of the process chamber 100. Although a showerhead 114 is shown, additional gas inlets may be provided such as nozzles or inlets disposed in the ceiling or on the sidewalls of the process chamber 100 or at other locations suitable for providing gases as desired to the process chamber 100, such as the base of the process chamber, the periphery of the substrate support, or the like.

In some embodiments, one or more RF plasma power sources (one RF plasma power source 148B shown) may be coupled to the process chamber 100 through one or more matching networks 146B for providing power for processing. In some embodiments, the process chamber 100 may utilize capacitively coupled RF power provided to an upper electrode proximate an upper portion of the process chamber 100. The upper electrode may be a conductor in an upper portion of the process chamber 100 or formed, at least in part, by one or more of the ceiling 142, the showerhead 114, or the like, fabricated from a suitable conductive material. For example, in some embodiments, the one or more RF plasma power sources 148B may be coupled to a conductive portion of the ceiling 142 of the process chamber 100 or to a conductive portion of the showerhead 114. The ceiling 142 may be substantially flat, although other types of ceilings, such as dome-shaped ceilings or the like, may also be utilized. The one or more plasma sources may be capable of producing up to 5000 W at a frequency of about 2 MHz and/or about 13.56 MHz, or higher frequency, such as 27 MHz and/or 60 MHz and/or 162 MHz. In some embodiments, two RF power sources may be coupled to the upper electrode through respective matching networks for providing RF power at frequencies of about 2 MHz and about 13.56 MHz. Alternatively, the one or more RF power sources may be coupled to inductive coil elements (not shown) disposed proximate the ceiling of the process chamber 100 to form a plasma with inductively coupled RF power.

In some embodiments, the inner process volume 104 may be fluidly coupled to the exhaust system 120. The exhaust system 120 may facilitate uniform flow of the exhaust gases from the inner process volume 104 of the process chamber 100. The exhaust system 120 generally includes a pumping plenum 124 and a plurality of conduits (not shown) that couple the pumping plenum 124 to the inner process volume 104 of the process chamber 100. Each conduit has an inlet 122 coupled to the inner process volume 104 (or, in some embodiments, the exhaust volume 106) and an outlet (not shown) fluidly coupled to the pumping plenum 124. For example, each conduit may have an inlet 122 disposed in a lower region of a sidewall or a floor of the process chamber 100. In some embodiments, the inlets are substantially equidistantly spaced from each other.

A vacuum pump 128 may be coupled to the pumping plenum 124 via a pumping port 126 for pumping out the exhaust gases from the process chamber 100. The vacuum pump 128 may be fluidly coupled to an exhaust outlet 132 for routing the exhaust to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

In operation, the substrate 110 may enter the process chamber 100 via an opening 112 in the chamber body 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region. After the substrate 110 is disposed within the process chamber 100, the chamber may be pumped down to a pressure suitable for forming a plasma and one or more process gases may be introduced into the chamber via the showerhead 114 (and/or other gas inlets). RF power may be provided to strike and maintain a plasma from the process gases to process the substrate.

Figure 1A:
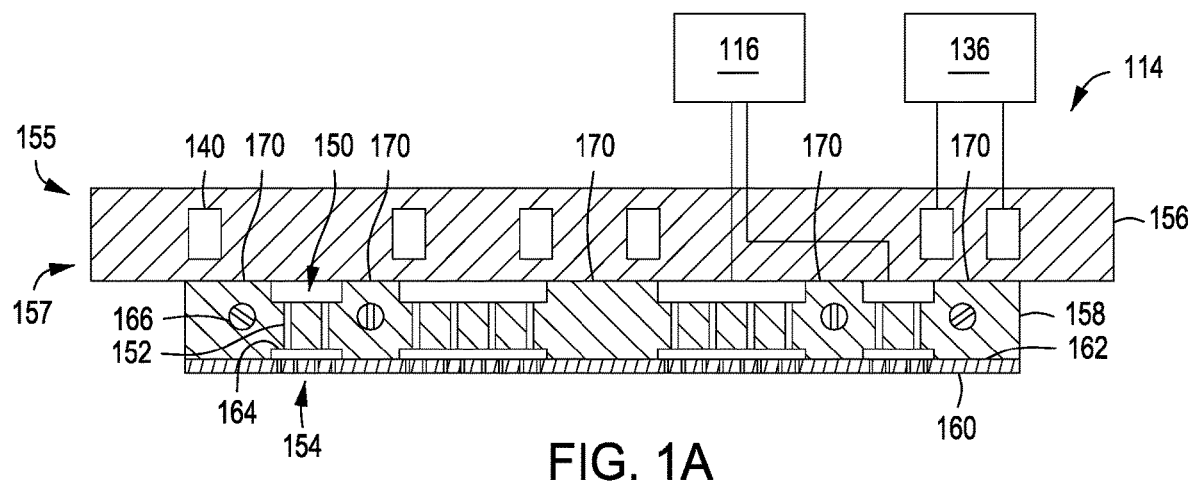
FIG. 1A depicts a cross-sectional schematic side view of a showerhead in accordance with some embodiments of the present disclosure.

During processing, such as in the above example, the temperature of the showerhead 114 may be controlled to provide a more uniform temperature profile across a substrate-facing surface of the showerhead 114. For example, FIG. 1A depicts a cross-sectional side view of a showerhead in accordance with some embodiments of the present disclosure. The showerhead 114 generally includes one or more plenums 150 coupled via a plurality of conduits 152 to a plurality of gas distribution holes 154 for providing process gases to the process chamber in a predetermined pattern. The plenums 150 may be arranged in zones and may be coupled to the gas supply 116 to provide one or more process gases to the plenums 150.

In some embodiments, the plenums 150 may be disposed between a heat transfer plate 156 and a first plate 158. The heat transfer plate has a first diameter. The plenums 150 may be formed entirely in the first plate 158 or partially in both plates. In the embodiments depicted in FIG. 1A, the plenums 150 are formed by recesses in the first plate 158 with the heat transfer plate 156 providing a cap which covers the recesses to define the plenums 150. In some embodiments, the width between the plenums 150, or the contact width contact width (e.g., 170 in FIG. 1A) between the heat transfer plate 156 and the first plate 158, may be between about 0.4 inches to about 4.0 inches. The contact width between the heat transfer plate 156 and the first plate 158 may vary among the different contact locations (such as the center, middle, and edge as depicted in FIG. 1A) as desired to provide additional control over the rate and/or pattern of thermal transfer between the heat transfer plate 156 and the first plate 158.

In some embodiments, the substrate facing side of the showerhead 114 may be provided by a substrate facing surface of a second plate (or faceplate 160) bonded via a bond layer 162 to the first plate 158. The faceplate 160 includes a plurality of gas distribution holes 154 having a size and geometry to provide the process gases from the plenum into the chamber in a predetermined volume and pattern. In some embodiments, a recess 164 may be provided in the substrate-facing side of the first plate 158 (or alternatively in the faceplate 160, or partially in both the body and the faceplate) to couple a plurality of the plurality of gas distribution holes 154 to a single one or more of the conduits 152. In some embodiments, the faceplate 160 may be fabricated from silicon carbide.

The showerhead 114 may include one or more mechanisms for controlling the temperature of the showerhead 114. For example, in some embodiments, one or more heaters may be disposed proximate the showerhead 114 to further facilitate control over the temperature of the faceplate 160 of the showerhead 114. In some embodiments, the first plate 158 may include one or more heater elements 166. FIG. 1 depicts an embodiment that includes a plurality of heater elements 166. The heater elements 166 may have a predetermined size and pattern to provide heat to the showerhead when desired to maintain a predetermined temperature and/or thermal profile across the substrate-facing surface of the showerhead 114, such as across the faceplate 160. As shown in FIG. 1A, the heater elements 166 are annular and concentric and are disposed in two zones (inner and outer zones), although other numbers and configurations may be used. In some embodiments, fewer or more heater elements 166 arranged in two or more zones may alternatively be disposed in the showerhead 114.

The heaters may be any type of heater suitable to provide control over the temperature profile of the substrate-facing surface of the showerhead 114. For example, the heater may be one or more resistive heaters. In some embodiments the heaters may be disposed below the plenums 150 (e.g., between the plenums 150 and the substrate facing surface of the showerhead 114, or the faceplate 160). The number and arrangement of the one or more heaters may be varied to provide additional control over the temperature profile of the substrate-facing surface of the showerhead 114. For example, in embodiments where more than one heater is utilized, the heaters may be arranged in a plurality of zones to facilitate control over the temperature across the substrate-facing surface of the showerhead 114, thus providing increased temperature control.

In addition, a plurality of channels 140 may be provided, for example in the heat transfer plate 156, to define a plurality of independent flow paths (described more fully below with respect to FIG. 2) to flow a heat transfer medium through the one or more channels 140. The heat transfer medium may comprise any fluid suitable to provide adequate transfer of heat to or from the showerhead 114. For example, the heat transfer medium may be a gas, such as helium (He), oxygen ($O_2$), or the like, or a liquid, such as water, antifreeze, or an alcohol, for example, glycerol, ethylene glycerol, propylene, methanol, or refrigerant fluid such as FREON® (e.g., a chlorofluorocarbon or hydrochlorofluorocarbon refrigerant), ammonia or the like.

A heat transfer medium source 136 may be coupled to the channels 140 to provide the heat transfer medium to the one or more channels 140. The heat transfer medium source 136 may comprise a temperature control device, for example a chiller or heater, to control the temperature of the heat transfer medium. One or more valves 139 (or other flow control devices) may be provided between the heat transfer medium source 136 and the one or more channels 140 to independently control a rate of flow of the heat transfer medium to each of the one or more channels 140. A controller 137 may control the operation of the one or more valves 139 and/or of the heat transfer medium source 136.

The one or more channels 140 may be formed within the showerhead 114, or the heat transfer plate 156, via any means suitable to form the one or more channels 140 having dimensions adequate to flow a heat transfer medium through the one or more channels 140. For example, in some embodiments, at least a portion of the one or more channels 140 may be partially machined into one or both of a separable top portion 155 and bottom portion 157 of the heat transfer plate 156. Alternatively, the one or more channels 140 may be fully machined into one of the top portion or bottom portion of the heat transfer plate 156. In such embodiments, the other portion may provide a cap of the channels 140 or an insert may be disposed in a portion of each channel 140 to provide a cap. In some embodiments, the one or more channels 140 comprise a plurality of channels having substantially equivalent fluid conductance and residence time.

Figure 2:
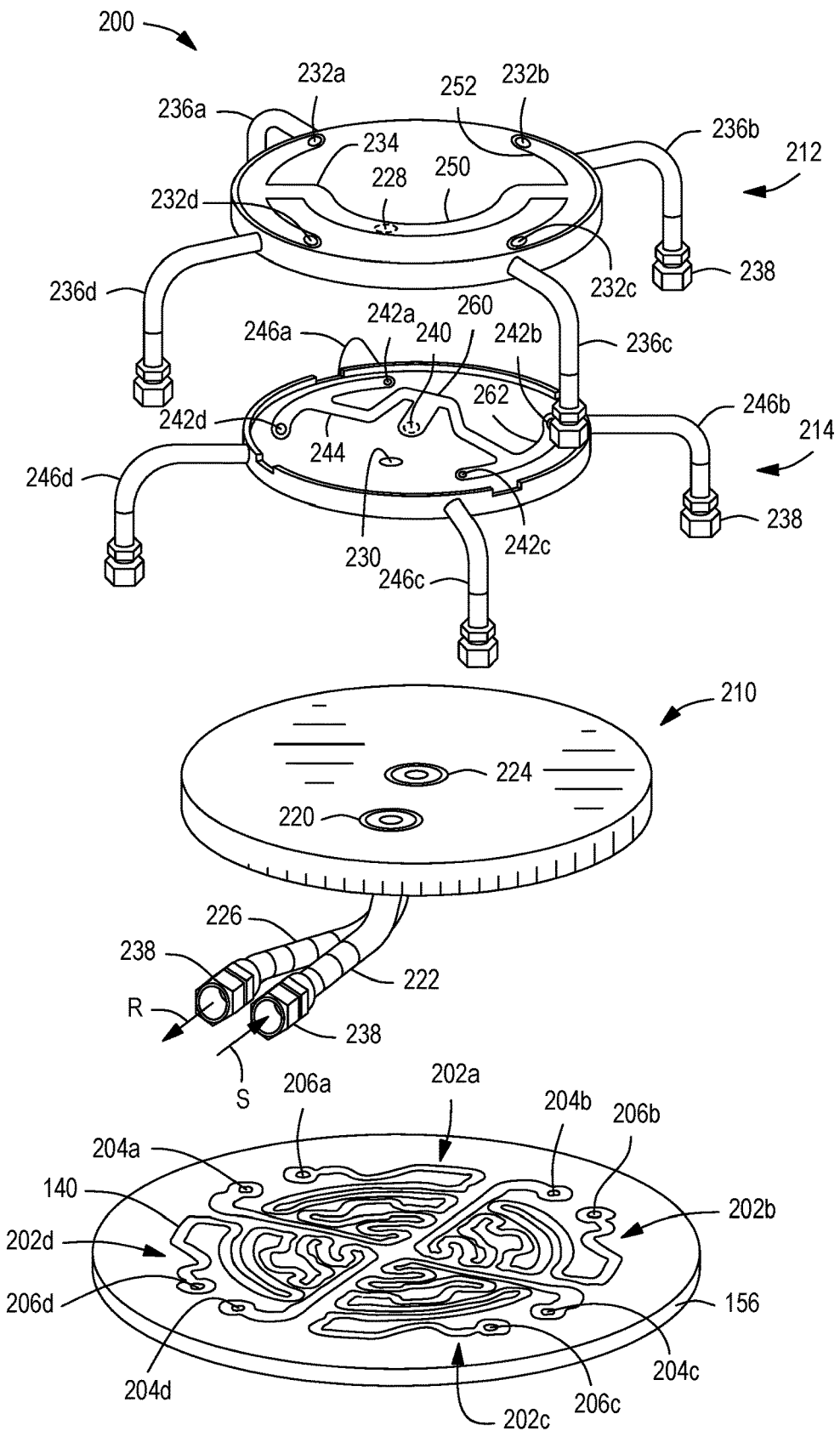
FIG. 2 depicts an exploded view of a heat transfer system in accordance with some embodiments of the present disclosure.

The one or more channels 140 may be configured in any manner suitable to provide adequate control over temperature profile across the substrate-facing surface of the showerhead 114 during use. For example, in some embodiments and as depicted in FIG. 2, the one or more channels 140 may define a plurality of independent flow paths (four shown) 202a-d having a substantially equal fluid conductance and residence time and a recursive symmetric pattern. In such embodiments, the plurality of flow paths 202a-d comprises a corresponding plurality of first inlets 204a-d and a corresponding plurality of first outlets 206a-d coupled, thus providing a flow path of heat transfer medium from each of the plurality of first inlets 204a-d to the respective ones of the plurality of first outlets 206a-d. The plurality of flow paths 202a-d may be coupled to a single heat transfer medium source (described above with respect to FIG. 1).

The plurality of flow paths 202a-d may be arranged in any manner suitable to provide temperature uniformity across the substrate facing surface of the showerhead 114. For example, in some embodiments, the plurality of flow paths 202a-d may be symmetrically positioned within the showerhead 114 to promote temperature uniformity. By utilizing a plurality of flow paths 202a-d the axial length of each of the plurality of flow paths 202a-d may be shortened, which may advantageously allow for a decreased change in temperature of the heat transfer medium along the flow paths 202a-d and thus an increased control over temperature profile due to the principles (e.g., residence time, fluid conductance, decreased pressure drop). In addition, by utilizing a plurality of flow paths 202a-d having a corresponding plurality of first inlets 204a-d, and corresponding plurality of first outlets 206a-d, such as depicted in FIG. 2, the total flow rate of heat transfer medium throughout the showerhead may be increased, further facilitating a decreased temperature range of the showerhead during use. In some embodiments, each of the plurality of flow paths 202a-d may be arranged to provide a counter flow within a given flow path. In some embodiments, each portion of the flow path adjacent to another flow path can be configured to provide counter flow. By providing each flow path, and optionally adjacent flow paths, in a counter flow configuration, temperature uniformity further improves. By providing similarly or identically shaped flow channels, the temperature profile of the substrate facing side of the showerhead 114 may additionally be made more azimuthally uniform.

FIG. 2 depicts an exploded view of a heat transfer system 200. To further improve the temperature uniformity of the showerhead 114, the inventors have provided the heat transfer system 200 which advantageously improves flow uniformity through the plurality of flow paths 202a-d. The heat transfer system 200 includes a base plate 210, a supply plate 212, and a return plate 214. The base plate includes a second inlet 220 fluidly coupled to a heat transfer supply line 222 and a third outlet 224 coupled to a heat transfer return line 226. The heat transfer supply line 222 and heat transfer return line 226 are fluidly coupled to the heat transfer medium source 136 to supply a heat transfer medium to and return the heat transfer medium from the heat transfer system 200.

The supply plate 212 includes a fourth inlet 228 (shown in phantom), which is fluidly coupled to the second inlet 220 via a through hole 230 disposed in the return plate 214. The fourth inlet 228 is fluidly coupled to a supply conduit system 302 (shown in cross section in FIG. 3) to flow the heat transfer medium to a plurality of second outlets 232a-d (shown in phantom in FIG. 2). In some embodiments, the supply conduit system 302 may be milled into the supply plate 212 and a first cap 234 is disposed atop the supply conduit system 302. A shape of the supply conduit system 302 is similar to the first cap 234. The plurality of second outlets 232a-d are fluidly coupled to a corresponding plurality of supply lines 236a-d to supply the heat transfer medium to corresponding ones of the plurality of flow paths 202a-d.

The return plate 214 includes a fourth outlet 240 (shown in phantom), which is fluidly coupled to the third outlet 224 of the base plate 210. The fourth outlet 240 is fluidly coupled to a return conduit system 304 (shown in cross section in FIG. 3) to flow the heat transfer medium from a plurality of third inlets 242a-d (shown in phantom in FIG. 2). In some embodiments, the return conduit system 304 may be milled into the return plate 214 and a second cap 244 is disposed atop the return conduit system 304. A shape of the return conduit system 304 is similar to the second cap 244. The plurality of third inlets 242a-d are fluidly coupled to a corresponding plurality of return lines 246a-d to receive the heat transfer medium from corresponding ones of the plurality of flow paths 202a-d after the fluid has flowed through the flow paths 202a-d. In some embodiments, each of the plurality of supply and return lines 236a-d, 246a-d may include a mechanical fixation element 238 to facilitate removably coupling the line to and inlet/outlet of the plurality of flow paths 202a-d or to another element (described below with respect to FIG. 4). For example, the mechanical fixation element 238 may be a socket nut that has threads which, when twisted onto an element with corresponding threads, removably fixes the line to the element.

Figure 3:
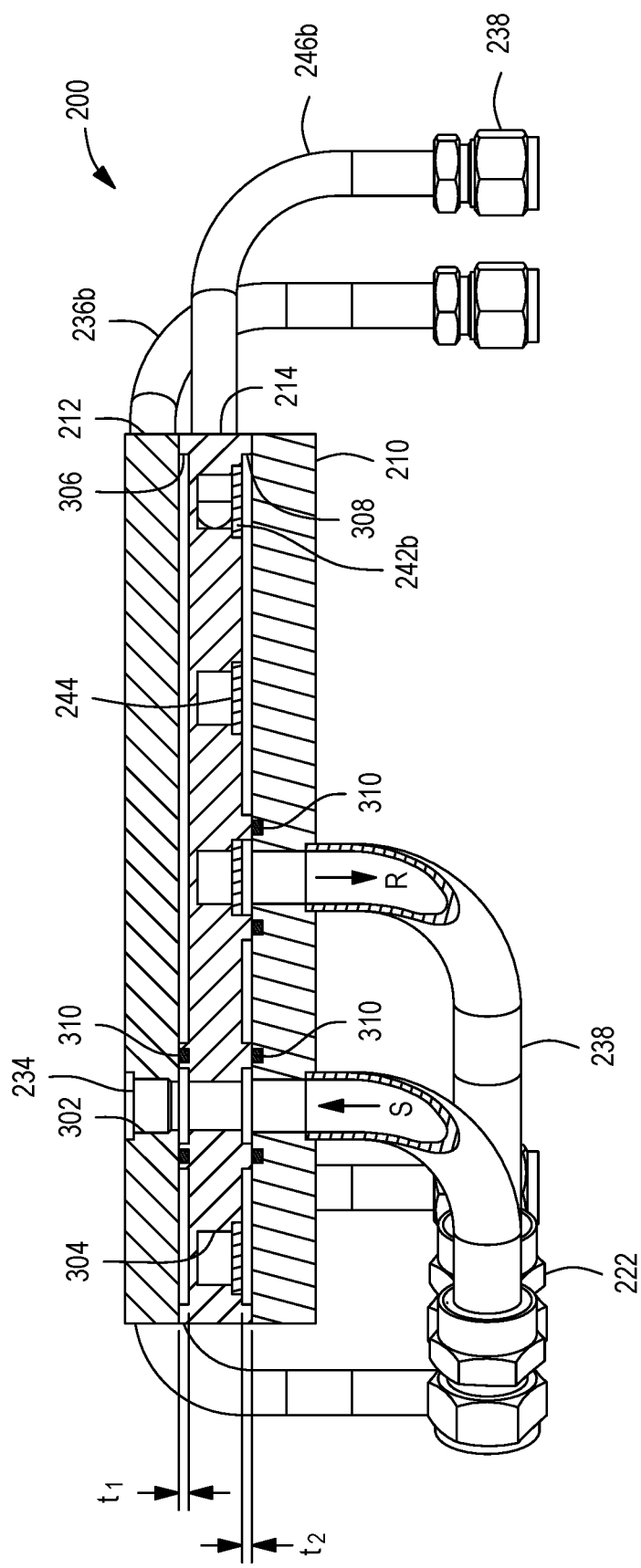
FIG. 3 depicts a cross-section side view of a heat transfer system in accordance with some embodiments of the present disclosure.

FIG. 3 depicts a cross-sectional view of the heat transfer system 200 as assembled. When assembled, the base plate 210, return plate 214, and supply plate 212 are stacked above one another. The respective plates may be fastened to one another via any suitable fastening means such as, for example, mating geometrical features in adjacent plates, clips, etc. To minimize thermal crosstalk between the various plates, the return plate 214 includes a first protruding surface 306 at an interface of the return plate 214 and the supply plate 212 to form a first gap having a thickness $t_1$ between the supply plate 212 and the return plate 214. The return plate 214 further includes a second protruding surface 308 at an interface of the return plate 214 and the base plate 210 to form a second gap having a thickness $t_2$ between the base plate 210 and the return plate 214. The thickness of each of the first and second gaps is sufficient to minimize thermal crosstalk between the adjacent plates. In some embodiments, the thicknesses $t_1$ and $t_2$ are each about 0.1 inches. However, the thicknesses $t_1$ and $t_2$ may be alternatively sized differently (i.e., $t_1 \neq t_2$). O-rings 310 are disposed in the base plate 210 around the second inlet 220 and the third outlet 224 as well as in the return plate 214 around the through hole 230 to ensure a fluid tight seal between adjacent plates.

Figure 4:
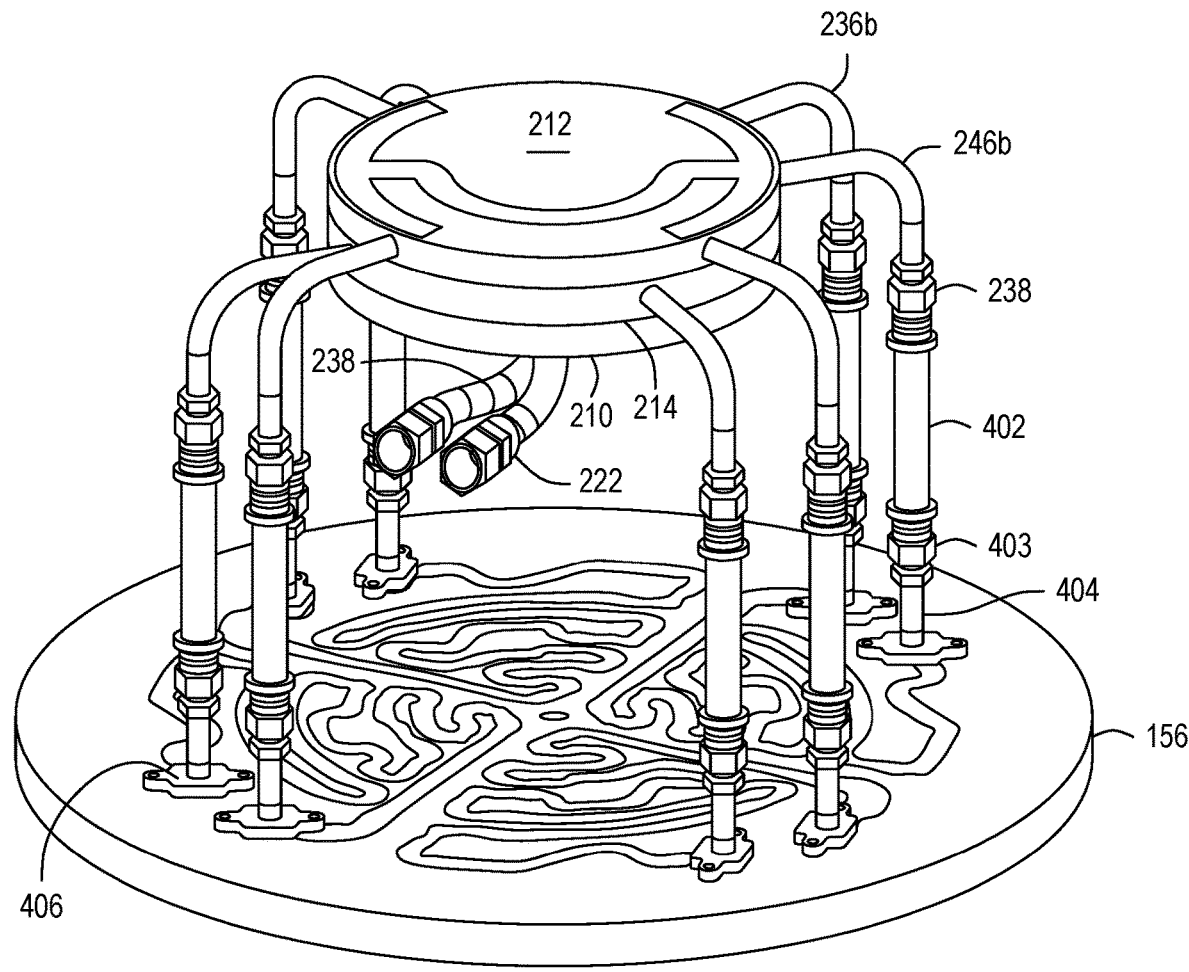
FIG. 4 depicts an isometric view of a heat transfer system in accordance with some embodiments of the present disclosure.

FIG. 4 depicts an isometric view of the assembled heat transfer system 200 coupled to the heat transfer plate 156. Some of the previously explained and illustrated features have been omitted from FIG. 4 to avoid obscuring the explanation of elements shown in FIG. 4. In some embodiments, each of the plurality of supply lines 236a-d and the plurality of return lines 246a-d may be coupled to a flexible line 402 via the mechanical fixation element 238. The use of flexible lines 402 allows for minor variations in the layout of the inlets and outlets of the heat transfer plate 156 when compared to another heat transfer plate. In some embodiments, the flexible lines may be formed of flexible braided stainless steel lines. Each flexible line 402 includes a second mechanical fixation element 403 similar to the mechanical fixation element 238 described above. Each flexible line 402 is coupled to a rigid line 404 an end opposite the supply or return line. The rigid line 404 is formed of a rigid, non-flexible material to ensure that the flow of heat transfer medium to/from the heat transfer plate 156 is unimpeded by any bends or kinks in the line proximate the heat transfer plate 156. Each rigid line 404 includes a mounting base 406 to facilitate mounting of rigid line 404 to one of the plurality of first inlets 204a-d or first outlets 206a-d of the heat transfer plate 156.

During use, a heat transfer medium flows from the heat transfer medium source 136, through the heat transfer supply line 222, and into the supply plate 212 via the through hole 230 and the fourth inlet 228. The heat transfer medium is then distributed from the fourth inlet 228 through the supply conduit system 302 to the plurality of second outlets 232a-d. In some embodiments, the conductance of the supply conduit system 302 is equivalent throughout the supply conduit system 302. In some embodiments, the conductance of the supply conduit system 302 may alternatively be less in first leg portions 252 proximate the plurality of second outlets 232a-d than in a first central portion 250 proximate the fourth inlet 228. As a result of the lesser conductance in the first leg portions 252, a flow rate of the heat transfer medium through the plurality of second outlets 232-a-d is substantially equivalent, thus advantageously improving the temperature uniformity across the showerhead 114.

The heat transfer medium next flows through the plurality of supply lines 236a-d to corresponding ones of the plurality of flow paths 202a-d through the plurality of first inlets 204a-d in the heat transfer plate 156. Subsequently, the heat transfer medium flows out of the plurality of first outlets 206a-d into corresponding ones of the plurality of return lines 246a-d and into the return plate 214 through the plurality of third inlets 242a-d. From the plurality of third inlets 242a-d, the heat transfer medium flows through the return conduit system 304 and into the fourth outlet 240. Similar to the supply conduit system 302, the return conduit system may have the same conductance throughout the return conduit system 304 or may alternatively have a lesser conductance in second leg portions 262 than in a second central portion 260 to ensure substantially equivalent flow through the plurality of return lines 246a-d. Subsequently, the heat transfer medium flows from the fourth outlet 240, through the third outlet 224, and back to the heat transfer medium source 136 via the heat transfer return line 226.

Figure 5:
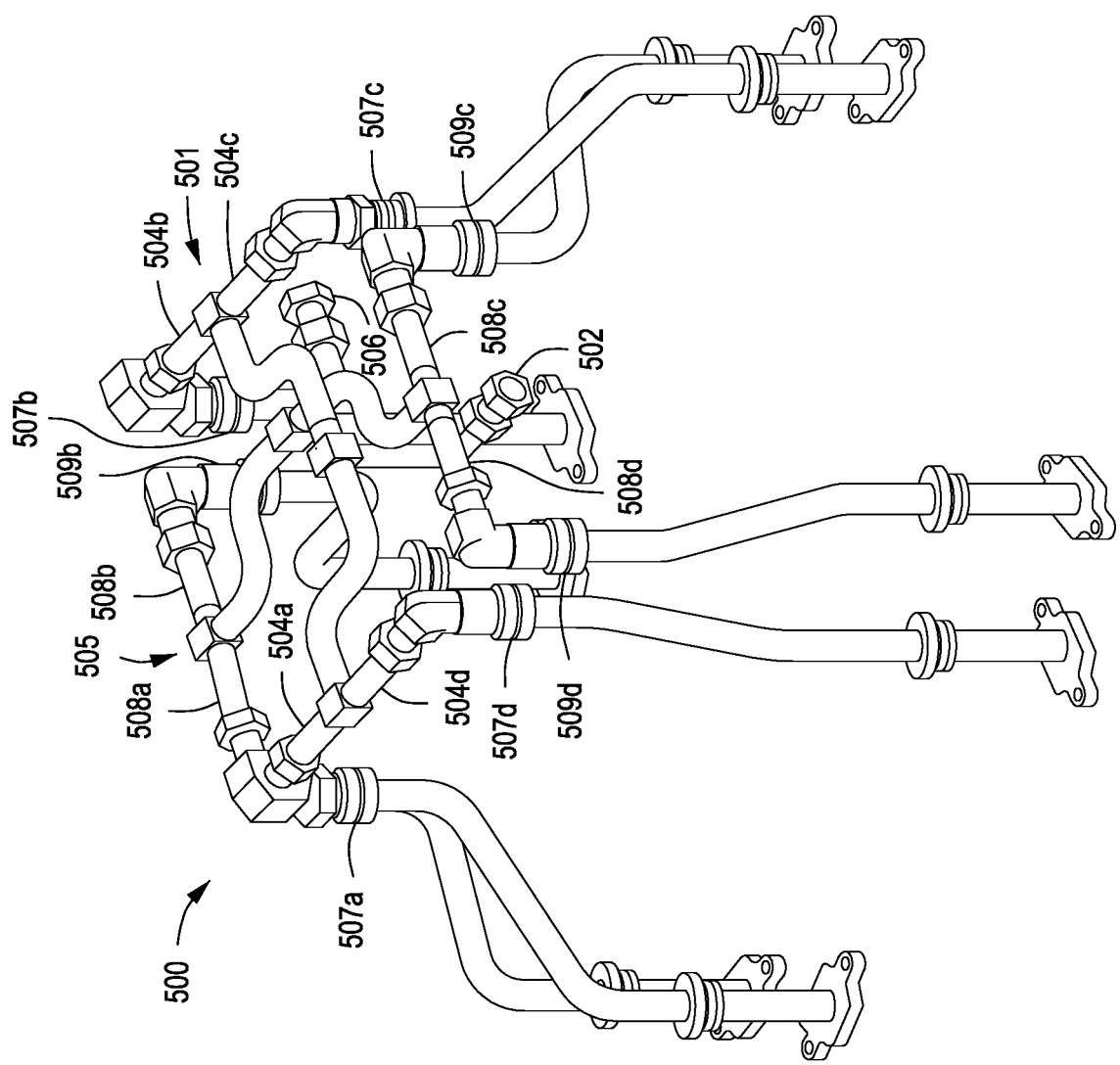
FIG. 5 depicts an isometric view of a heat transfer system in accordance with some embodiments of the present disclosure.

FIG. 5 depicts an isometric view of a heat transfer system 500 in accordance with some embodiments of the present disclosure. A description of elements that are substantially similar to those described above will be omitted here for clarity. The heat transfer system 500 differs from the heat transfer system 200 in that the heat transfer system 500 does not include supply and return plates. In some embodiments, a heat transfer system 500 may include a supply conduit system 501 and a return conduit system 505. The supply conduit system 501 includes a second inlet 502 coupled to a plurality of supply lines 504a-d having a corresponding plurality of second outlets 507a-d. The return conduit system 505 includes a plurality of return lines 508a-d coupled to a third outlet 506. The plurality of return lines 508a-d includes a corresponding plurality of third inlets 509a-d (509a not visible in FIG. 5 because of orientation).

During use, a heat transfer medium flows from the heat transfer medium source 136, through the heat transfer supply line 222, and into the second inlet 502. The heat transfer medium is then distributed from the second inlet 502 to the supply lines 504a-d. The heat transfer medium next flows out of the plurality of second outlets 507a-d and through the plurality of first inlets 204a-d to corresponding ones of the plurality of flow paths 202a-d in the heat transfer plate 156. Subsequently, the heat transfer medium flows out of the plurality of first outlets 206a-d into corresponding ones of the plurality of return lines 508a-d via the plurality of third inlets 509a-d, and out of the third outlet 506. In some embodiments, the conductance of the supply conduit system 501 and the return conduit system 505 is equivalent. In some embodiments, the conductance of the return conduit system 505 is less than that of the supply conduit system 501.

In some embodiments, the supply conduit system and the return conduit system are each disposed within an imaginary cylindrical projection above the heat transfer plate. For example, as shown in FIG. 5, in some embodiments, each of a first pair of supply lines (e.g., 505a,d) and a second pair of supply lines (e.g., 504 b,c) extends upward and subsequently extends toward the opposing supply line of the corresponding pair until the two supply lines meet. Subsequently, the combined supply line from each pair extends radially inward and intersects the opposing combined supply line. The second inlet 502 is fluidly coupled to the intersection of the two combined supply lines. The structure of the return lines 508a-d is similar to that of the return lines 504a-d just described. The inventors have observed that such a configuration of the supply and return lines advantageously results in the greatest thermal isolation of the supplied heat transfer medium and the returned heat transfer medium. As such, the supplied heat transfer fluid supplied to the heat transfer plate 156 substantially unaffected by the temperature of the returned heat transfer medium.

While the foregoing is directed to embodiments of the present disclosure, other and further embodiments of the disclosure may be devised without departing from the basic scope thereof.

The invention claimed is:

1. A heat transfer system, comprising:
a heat transfer plate having a first diameter and a plurality of independent flow paths disposed within the heat transfer plate, each flow path having a first inlet and a first outlet;
a base plate including a second inlet and a third outlet disposed above the heat transfer plate;
a supply plate that includes a supply conduit system that fluidly couples the second inlet to a plurality of second outlets via a fourth inlet, wherein each second outlet is fluidly coupled to a corresponding first inlet of the heat transfer plate; and
a return plate that includes a return conduit system that fluidly couples the third to a plurality of third inlets via a fourth outlet,
wherein each third inlet is fluidly coupled to a corresponding first outlet of the heat transfer plate, and
wherein the supply conduit system and the return conduit system are each disposed within an imaginary cylindrical projection above the heat transfer plate.

2. The heat transfer system of claim 1, wherein an outer sidewall of the base plate is substantially coplanar with an outer sidewall of the supply plate and an outer sidewall of the return plate.

3. The heat transfer system of claim 2, wherein the base plate, the supply plate, and the return plate are stacked above one another such that the return plate is disposed between the base plate and the supply plate and the base plate is spaced from the supply plate.

4. The heat transfer system of claim 3, wherein the return plate includes a through hole fluidly coupling the fourth inlet to the second inlet.

5. The heat transfer system of claim 4, wherein the return plate includes a first protruding surface at an interface of the return plate and the supply plate and a second protruding surface at an interface of the return plate and the base plate, and wherein the first protruding surface forms a first gap having a first thickness between the return plate and the supply plate and the second protruding surface forms a second gap having a second thickness between the return plate and the base plate.

6. The heat transfer system of claim 1, further comprising:
a plurality of supply lines extending from an outer sidewall of the supply plate, each of which is fluidly coupled to one of the plurality of second outlets at a first end and to a corresponding first inlet at a second end opposite the first end; and
a plurality of return lines extending from an outer sidewall of the supply plate, each of which is fluidly coupled to a corresponding first outlet at a third end and to one of the plurality of third inlets at a fourth end opposite the third end.

7. The heat transfer system of claim 1, wherein each of the plurality of independent flow paths comprises a recursive symmetric pattern.

8. A process chamber, comprising:
a showerhead having a substrate facing surface and one or more plenums for providing one or more process gases through a plurality of gas distribution holes formed through the substrate facing surface of the showerhead; and
a heat transfer system coupled to the showerhead, the heat transfer system comprising:
a heat transfer plate having a first diameter and a plurality of independent flow paths disposed within the heat transfer plate, each flow path having a first inlet and a first outlet;
a base plate including a second inlet and a third outlet disposed above the heat transfer plate;
a supply plate that includes a supply conduit system that fluidly couples the second inlet to a plurality of second outlets via a fourth inlet,
wherein each second outlet is fluidly coupled to a corresponding first inlet of the heat transfer plate; and
a return plate that includes a return conduit system that fluidly couples the third outlet to a plurality of third inlets via a fourth outlet,
wherein each third inlet is fluidly coupled to a corresponding first outlet of the heat transfer plate, and
wherein the supply conduit system and the return conduit system are each disposed within an imaginary cylindrical projection above the heat transfer plate.

9. The process chamber of claim 8, wherein an outer sidewall of the base plate is substantially coplanar with an outer sidewall of the supply plate and an outer sidewall of the return plate.

10. The process chamber of claim 9, wherein the base plate, the supply plate, and the return plate are stacked above one another such that the return plate is disposed between the base plate and the supply plate and the base plate is spaced from the supply plate.

11. The process chamber of claim 10, wherein the return plate includes a through hole fluidly coupling the fourth inlet to the second inlet.

12. The process chamber of claim 11, wherein the return plate includes a first protruding surface at an interface of the return plate and the supply plate and a second protruding surface at an interface of the return plate and the base plate, and wherein the first protruding surface forms a first gap having a first thickness between the return plate and the supply plate and the second protruding surface forms a second gap having a second thickness between the return plate and the base plate.

13. The process chamber of claim 12, wherein the heat transfer system further comprises:
a plurality of supply lines extending from an outer sidewall of the supply plate, each of which is fluidly coupled to one of the plurality of second outlets at a first end and to a corresponding first inlet at a second end opposite the first end; and
a plurality of return lines extending from an outer sidewall of the supply plate, each of which is fluidly coupled to a corresponding first outlet at a third end and to one of the plurality of third inlets at a fourth end opposite the third end.

14. The process chamber of claim 8, further comprising:
a heat transfer medium source fluidly coupled to the second inlet and the third outlet to respectively supply and receive a heat transfer medium to and from the heat transfer system.

15. The process chamber of claim 8, wherein each of the plurality of independent flow paths comprises a recursive symmetric pattern.

16. The process chamber of claim 8, wherein the showerhead further comprises one or more heater elements configured to heat the showerhead.

17. The process chamber of claim 16, wherein the one or more heater elements comprises a plurality of heater elements arranged in two or more zones.

18. A heat transfer system, comprising:
a heat transfer plate having a first diameter and a plurality of independent flow paths disposed within the heat transfer plate, each flow path having a first inlet and a first outlet;
a base plate including a second inlet and a third outlet disposed above the heat transfer plate;
a supply plate that includes a supply conduit system that fluidly couples the second inlet to a plurality of second outlets via a fourth inlet, wherein each second outlet is fluidly coupled to a corresponding first inlet of the heat transfer plate; and
a return plate that includes a return conduit system that fluidly couples the third outlet to a plurality of third inlets via a fourth outlet,
a plurality of supply lines, each of which is fluidly coupled to one of the plurality of second outlets at a first end and to a corresponding first inlet at a second end opposite the first end; and
a plurality of return lines, each of which is fluidly coupled to a corresponding first outlet at a third end and to one of the plurality of third inlets at a fourth end opposite the third end,
wherein the supply conduit system and the return conduit system are each disposed within an imaginary cylindrical projection above the heat transfer plate.

19. The heat transfer system of claim 18, wherein the base plate, the supply plate, and the return plate are stacked above one another such that the return plate is disposed between the base plate and the supply plate and the base plate is spaced from the supply plate.

20. The heat transfer system of claim 19, wherein the return plate includes a first protruding surface at an interface of the return plate and the supply plate and a second protruding surface at an interface of the return plate and the base plate, and wherein the first protruding surface forms a first gap having a first thickness between the return plate and the supply plate and the second protruding surface forms a second gap having a second thickness between the return plate and the base plate.

* * * * *

UNITED STATES PATENT AND TRADEMARK OFFICE
CERTIFICATE OF CORRECTION

PATENT NO. : 10,780,447 B2
APPLICATION NO. : 15/497814
DATED : September 22, 2020
INVENTOR(S) : Fovell et al.

Page 1 of 1

It is certified that error appears in the above-identified patent and that said Letters Patent is hereby corrected as shown below:

In the Claims

Column 12, in Line 50, delete "plate; and" and substitute "plate;"

Column 12, in Line 53, delete "outlet," and substitute "outlet, wherein each third inlet is fluidly coupled to a corresponding first outlet of the heat transfer plate;"

Signed and Sealed this
Tenth Day of November, 2020

Andrei Iancu
*Director of the United States Patent and Trademark Office*